INVENTOR.
HENDRIK A. KLASENS
BY Frank R. Trifari
AGENT

INVENTOR.
HENDRIK A. KLASENS
BY
Frank R. Jifani
AGENT

United States Patent Office 3,442,647

Patented May 6, 1969

3,442,647

METHOD OF MANUFACTURING SEMICONDUCTOR DEVICES AND SEMICONDUCTOR DEVICES MANUFACTURED BY SUCH METHODS

Hendrik Anne Klasens, Emmasingel, Eindhoven, Netherlands, assignor, by mesne assignments, to U.S. Philips Corporation, New York, N.Y., a corporation of Delaware Filed June 1, 1964, Ser. No. 371,386
Claims priority, application Netherlands, June 20, 1963, 294,370
Int. Cl. G03c 5/00
U.S. Cl. 96—36.2 9 Claims

ABSTRACT OF THE DISCLOSURE

Improvements in or relating to methods of manufacturing semiconductor devices and semiconductor devices manufactured by such methods.

This invention relates to methods of manufacturing semiconductor devices comprising at least one transistor which is provided in a semiconductor layer on a carrier and which at least two electrodes, namely a source electrode and a drain electrode, which are spaced from each other on the semiconductor layer and form a first electrode pattern, together with at least one gate electrode which is connected to a portion of the semiconductor layer located between the source and drain electrodes and which constitutes a second electrode pattern.

The invention also relates to semiconductor devices comprising such transistors as manufactured by the use of a method according to the invention.

Transistors of the kind herein referred to which, either singly or in a large number, are built up, if desired in combination with other circuit elements, in and on a semiconductor layer on a carrier to form a semiconductor device are already known inter alia from Proceedings Institute of Radio Engineers 50 (June 1962), pages 1462 to 1496. In the design most commonly employed use is made of an insulating carrier, for example, of ceramic material or glass, on which the source and drain electrodes in the form of conductive strips, for example of gold, are evaporation-deposited side by side and with a very small spacing with the use of a mask comprising a wire grid to permit exact adjustment of the spacing between the source and drain electrodes. On the carrier covered with the said first electrode pattern there is provided a thin semiconductor layer, for example, of cadmium sulphide and on this layer the electrode pattern of the gate conductor is evaporation-deposited, preferably separated from the semiconductor by a thin insulating layer, so that the gate conductor is connected to a portion of the semiconductor layer which is located between the source and drain electrodes. The operation of such a transistor, which is known inter alia under the English name Thin Film Transistor (abbreviation TFT), is based on the known effect that the impedance of the semiconductor layer in the current path between the source and drain electrodes may be influenced by means of the gate electrode. The publications previously referred to also disclose other embodiments in which the gate electrode is present on the side of the carrier and the source and drain electrodes are located on the opposite side of the semiconductor layer, or in which the source electrode, the gate electrode and the drain electrode are situated in this sequence in juxtaposition on the same side of the semiconductor layer.

For satisfactory operation of such a transistor, very small dimensions in the electrode pattern of the source and drain electrodes are aimed at, for example, a distance of 5 microns between the electrodes, while the gate electrode has to be provided in a separate operation so as to be connected to the portion of the semiconductor layer located between the source and drain electrodes. For high-frequency operation it is furthermore desirable that interfering capacities between the gate electrode and the source electrode and between the gate electrode and the drain electrode, which are caused by overlapping parts of the said electrodes, are avoided as far as possible.

An object of the invention is inter alia to provide a method by which semiconductor devices comprising one or more transistors which highly satisfy the severe requirements imposed above may be manufactured in a simple and reproducible manner.

To this end, according to the invention, in a method of the kind mentioned in the preamble, at first one of the said two electrode patterns, either the pattern comprising the source and drain electrodes or the pattern of the gate electrode, is formed at least in part and afterwards, with the aid of an optical image of the electrode pattern already formed, the other electrode pattern is formed by means of a photographic process so that, as viewed in a direction at right angles to the semiconductor layer, the two electrode patterns are substantially complementary to one another, at least in part, and do not substantially overlap.

The term "photographic process" is to be understood herein to mean a process in which a photochemically sensitive layer upon irradiation is influenced by a photochemical process so that its solubility is locally varied permanently or in which a photochemical reaction product is formed and may be changed to an electrically conductive metallic image either directly or by means of one or more secondary chemical reactions.

Since, in a method according to the invention, an image of the one electrode pattern previously mentioned is optically produced at the area in the semiconductor device which is desired for the other electrode pattern and this other electrode pattern is manufactured from the said optical image by means of a photographic process, the desired relative positioning of the electrode patterns and the obtainment of a substantially complementary shape in that portion of the semiconductor layer in which the electrode patterns for the formation of a transistor are very close to one another is possible in a very simple and very reproducible manner. This affords a great advantage especially when taking into account the small dimensions which are desirable for the active portion of such a transistor. The electrode pattern to be formed first may be applied in any suitable manner, for example, by evaporation-deposition by means of a mask or, if desired, by photographic means.

A large number of different photographic processes are known which enter into account for use in a method according to the invention. It will be evident that not all these processes can be described herein in detail, so that it may suffice to give an enumeration and short indication of the most important processes, several of which will be explained in detail in the examples for illustration of the invention, while for details of the other processes reference is made to the professional literature in the field of photography and the technique of the photogravure.

The so-called photoresist processes are especially suitable for use in a method according to the invention.

In such processes a photochemically sensitive layer is used, usually referred to as "photoresist," which may serve as a mask for selectively forming a metallic layer or for selectively retaining a metallic layer already formed during an etching process. Distinction is made between a positive photoresist which is selectively soluble at the areas irradiated and a negative photoresist which becomes selectively insoluble at the areas irradiated. Both processes are suitable for use in a method according to the invention and will be described in detail in the examples. In photoresist processes the photoresist may be used not only as a mask but also for directly applying the electrode material if the electrode material is previously provided in the photoresist in the finely divided state and, after removal of the soluble portions of the pattern, the insoluble portions may be united with the carrier of the semiconductor body, for example by heating, to form a conductive junction. Thus for instance gelatine or polyvinylalcohol with bichromate can be used which contains for instance a few percent by weight of colloidal metal, like gold, for this purpose. The metal may be united with the substrate by heating, and may, if desired, be strengthened afterwards by physical development to form a thicker layer.

In addition to the above-mentioned photoresist processes, other photochemical processes are known in which a photochemical reaction product may yield a conductive pattern either directly or indirectly by means of secondary chemical reactions. In this connection reference is made, for example, to the known photographic process which utilises a photo-sensitive emulsion containing silver bromine. The latent image produced after exposure is developed in known manner, silver being deposited at the areas exposed. The metallic silver may, if desired, be replaced by another metal, for example, gold, after treatment with a solution containing chloride and gold, whereafter the soluble compounds are dissolved with the aid of a fixing bath. At the remaining areas the silver or the metal replacing it is present in a carrier, for example, of gelatin. The metal may be united with the substrate by heating, for example, to form a diffused electrode which may be strengthened afterwards, if desired, to form a thicker layer. A plurality of further photochemical processes are known which utilize photosensitive compounds of which the light reaction product formed upon exposure deposits metallic mercury and/or silver in the form of a latent metal nuclear image from a soluble mercurous and/or silver compound in the presence of moisture. The said metal nuclear image is strengthened into an electrically conductive metallic image by means of physical development with the aid of a solution of a metal salt and a photographic reducing agent. Examples of such photosensitive compounds are aromatic diazosulphonates, aromatic diazocyanides, anthraquinone- and naphthquinone derivatives and a plurality of complex metal compounds. In addition to the said photoresist methods, the last-described photochemical methods, which may yield a complementary conductive pattern without the use of a mask, also enter into account for use in a method according to the invention.

In one very suitable embodiment of the invention, the optical image of the one electrode pattern already formed is produced by irradiation through the carrier, use being made of the shadow effect of the one electrode pattern, and a photochemically sensitive material is applied at the area of the other electrode pattern and reacts photochemically upon the radiation to which the carrier and any further intermediate layers of the semiconductor device are pervious at least in part. When using a carrier of transparent material, for example of glass, use may be made of conventional photochemical materials which are sensitive to visible light. Instead of exposure through the carrier, under certain conditions, when a suitable photoresist is used and the materials of the one electrode pattern and the substrate are such that a distinct difference in reflective or absorptive capacity exists, it is possible to expose the layer from the other side through the photochemical layer, as is known from reflex-photography, in which use is made of the difference in intensity of the radiation reflected by the one electrode pattern as compared with its ambience. When using such reflex-photographic methods it is possible to use an opaque carrier. Still the first-mentioned exposure through the carrier is generally preferable since the conditions for the use of reflex-photographic methods are very critical.

The two electrode patterns may be formed on the same side of a semiconductor layer, either on the side of the carrier or on the side remote from the carrier. In either case the pattern comprising the source and drain electrode is provided in directly conductive connection to the semiconductor layer, while the electrode pattern of the gate electrode is formed between the source and drain electrodes and engages the semiconductor layer through an insulating layer which also provides for electrical installation from the source and drain electrodes. If in the manufacture of such a configuration according to the invention an irradiation through the carrier is used preferably both electrode patterns are formed on the carrier side of the semiconductor layer. For this purpose the pattern of the gate electrode is first provided on the carrier and at least the portion of the carrier covered with the gate electrode pattern is covered with an insulating layer and then a photographic process is used to form, while irradiating through the carrier, the pattern of the drain and source electrodes which is substantially complementary at least in part, whereafter the semiconductor layer is provided on the pattern of the source and drain electrodes and on the insulating layer present on the gate electrode pattern. This embodiment according to the invention affords the advantage that the choice of the semiconductor material is independent of the choice of the photographic process. It is thus possible, for example, to use a semiconductor layer which is not pervious to the radiation wavelengths desirable for the photochemical process.

The invention is also very suitable, however, for the manufacture of semiconductor devices in which one electrode pattern lies on the side of the carrier and the other on that side of the semiconductor layer which is remote from the carrier. According to the invention, to this end, one preferably proceeds in such manner that one of the two electrode patterns is first formed on the carrier and then the semiconductor layer, whereafter the other electrode pattern, which is complementary at least, in part, is formed on the other side of the semiconductor layer by means of a photographic process while irradiating through the carrier and the semiconductor layer and with the use of the shadow effect of the pattern previously provided. In this method according to the invention, the semiconductor and the photochemically-sensitive substance must be coordinated with each other that the semiconductor layer is sufficiently pervious to the radiation wavelengths required for the photochemical reaction. However, since preferably semiconductors with a large energy gap are used in transistors of the kind referred to, such coordination need not be objectionable. Thus, in this connection a semiconductor consisting of $SnO_2$ or $In_2O_3$ may advantageously be used since these substances are sufficiently pervious to the radiation wavelength required for the photochemical materials most commonly used and also have suitable semiconductor properties. However, it is also possible to use semiconductors with a smaller energy gap such as, for example, cadmium sulphide, by using a photochemical substance, for example, a photoresist having a considerable sensitivity in the long-wave portion of the visible spectrum. Since an insulating layer is usually provided between the gate electrode and the semiconductor layer such a layer must also be pervious to the relevant radiation if it would extend beyond the edge of the one electrode pattern at least to an interfering extent. In this case it is possible, for example, to use silicon oxide (SiO) as the insulating layer.

Lastly, the invention also relates to the semiconductor device manfactured by the use of a method according to the invention.

In order that the invention may be readily carried into effect, it will now be described in detail, by way of example, with reference to a few embodiments shown in the accompanying diagrammatic drawings in which:

Of FIGURES 1 to 3, which relate to one embodiment, FIGURE 1 is a sectional view of one stage of the manufacture according to the invention, while FIGURE 2 shows the corresponding elevational view as viewed from the carrier. FIGURE 3 is an elevational view at a later stage of the manufacture;

Certain dimensions are shown with exaggeration for the sake of clarity, especially the thicknesses of the layers.

Figures 1, 2:
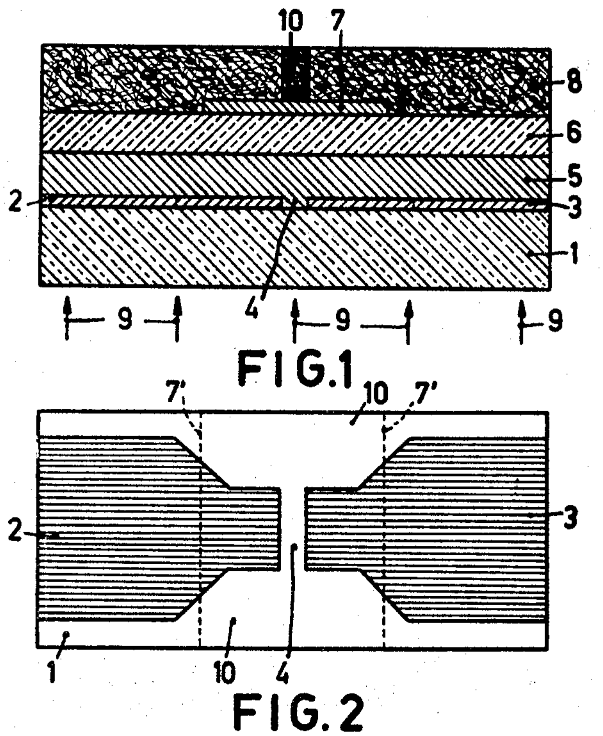
Figure 3:
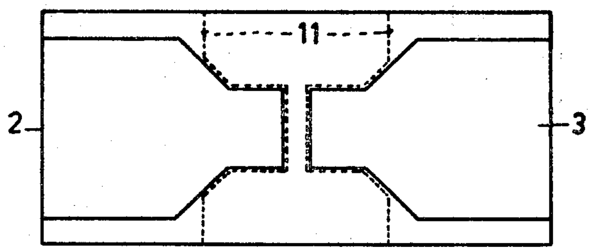

With reference to FIGURES 1 to 3, at first a very suitable embodiment according to the invention will be described which utilizes a photoresist process with a negative photoresist.

The electrode pattern comprising a source electrode 2 and a drain electrode 3 is first evaporation-deposited on a flat glass plate 1 used as a carrier (see FIGURES 1 and 2), for example, by means of a mask having an aperture corresponding to the desired electrode pattern 2, 3. FIGURE 2 is an elevational view as viewed through the carrier, of the electrode pattern, which consists, for example, of a silver layer of about 300 A. thick, while FIGURE 1 is a cross sectional view thereof, taken along the center of FIGURE 2. The width of a gap 4 between the source and drain electrodes 2, 3 is, for example, approximately 10 microns. The width of the two electrode layers 2 and 3 near the gap 4 is about 2 mm. and progressively increases at some distance from the gap 4, for example, up to 5 mm. The shape and dimensions of the electrode pattern 2, 3 are otherwise not essential to the invention but chosen only by way of example. So the widened portion, for example, may also be emitted.

The electrode pattern 2, 3 and the remaining portion of the carrier 1 are subsequently covered, for example, by evaporation-deposition, with a semiconductor layer 5, for example, of $SnO_2$ which is n-type conductive and has a specific resistance of, for example, approximately 1 ohm-cm. The semiconductor layer, which is usually very thin in transistors of this type, is for example, approximately 0.1 micron thick. A thin electrically insulating layer 6, for example, of silicon oxide having a thickness of, for example, 500 A. is evaporation-deposited on the semiconductor layer 5. The insulating layer 6 may extend, as shown in FIGURE 1, throughout the semiconductor layer 5 or, if desired, only over a portion 11 thereof which is occupied afterwards by the pattern of the gate electrode. A thin metal layer 7, for example, of gold having a thickness of, say, 200 A. from which the gate electrode pattern will be formed afterwards by the use of the invention is evaporation-deposited on the insulating layer 6. FIGURE 2 shows that the layer 7 has, for example, the form of a rectilinear strip located between the broken lines 7′. The provision of the strip 7 is a simple matter. It is necessary only to ensure that, as viewed in a direction at right angles to the carrier, it overlaps the effective portion of the electrode pattern 2, 3 which is located near the gap 4 so that the surface area desired for the gate electrode pattern may be manufactured therefrom.

Now a photosensitive emulsion 8 is applied to the layer 7 and, if desired, also to the surface area of the gate-insulating layer 6 which is located next to it, said photosensitive emulsion being a negative photoresist which is selectively sensitive to radiation which is sufficiently transmitted by the carrier 1, the semiconductor 5, the insulating layer 6 and the metal layer 7, which latter is made sufficiently thin for this purpose, while the electrode pattern 2, 3 either transmits the relevant radiation with attenuation or intercepts it to produce afterwards an optical image in the photoresist layer 8 by means of shadow effect.

Examples of suitable negative photoresists which are commercially sold together with their associated developers for dissolving unexposed nonhardened portions of the photoresist are inter alia Kodak Photoresist (KPR), Kodak Photo Etching Resist (KPER) and Kodak Metal Etching Resist (KMER), which are especially sensitive in the shortwave portion of the visible spectrum. Another example of such a photoresist is polyvinyl butyral which may contain, as usual sensitizing agents, chromates, bichromates, for example, of calcium or ammonium, and photosensitive diazo—or diazonium compounds. In the case of polyvinyl butyral, for example, ethanol may be used as a developer for washing the unexposed parts.

After the photoresist 8 is provided, there is exposed through the carrier by means of a light beam 9, shown diagrammatically, which penetrates at least in part through the sequential layers 1, 5, 6 and 7 into the photoresist 8. The light 9 is intercepted completely or at least for the greater part at the electrode pattern 2, 3 so that an optical image is produced in the photoresist layer 8 due to the shadow effect of the electrode pattern 2, 3. For this purpose the electrode pattern 2, 3 is shown shaded in FIGURE 2. The photoresist 8 now becomes selectively insoluble at the exposed areas 10 by means of a photochemical reaction with the light.

After removal of the photoresist at the unexposed areas 8 by means of a solvent associated with the photoresist, a photoresist pattern 10 having a shape complementary to the electrode pattern 2, 3 subsists on the metal layer 7 and the portion of the insulating layer 6 located next to it. The said complementary photoresist pattern is now used as a mask during an etching treatment whereby the portions of the metal layer 7 located outside the photoresist pattern 10 are etched away. Thus, a conductive pattern subsists on the insulating layer 6, which is usable as a gate electrode and which has a substantially complementary shape near the source and drain electrodes, as appears from the ultimate boundary of the layer 7 shown in broken lines 11 in FIGURE 3. The remaining photoresist, if not interfering for the further treatment and the function of the device, may remain behind or be removed in a manner which is usual therefor.

It will be evident that numerous variations in the method described hereinbefore are possible. Thus, for example, the same method with a negative photoresist may be used if the gate electrode pattern with the associated insulating layer is first applied to a carrier and then the pattern of the source and drain electrodes is formed on the other side of the semiconductor layer in an analogous photographic manner according to the invention. In FIGURE 1 the light beam is shown diagrammatically as comprising a light beam which is substantially parallel and incident on the carrier at right angles. Although preferably used, such a beam is not required in most cases since with the usual small thicknesses of the sequential layers a very good shadow effect is also obtained if the light is not incident at right angles or not parallel, so that the desired complementary form is obtained without substantial overlapping of the electrode patterns.

Figure 4:
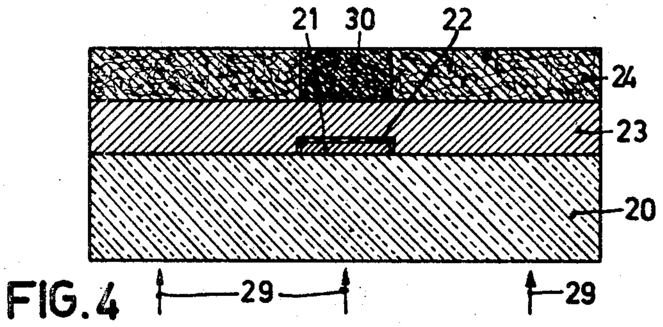
FIGURES 4 to 6 are sectional views of three sequential stages of another embodiment of the method according to the invention.
Figure 5:
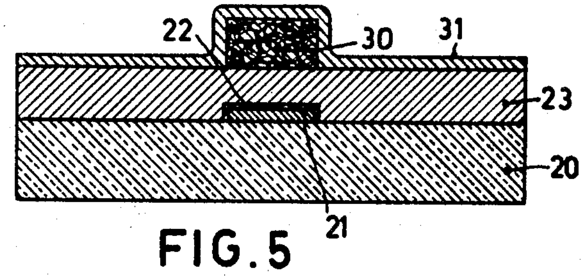
Figure 6:
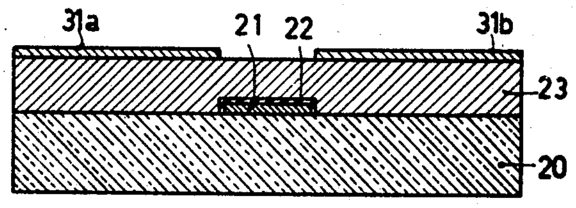

Another suitable embodiment of the method according to the invention which utilises a positive photoresists, will now be described with reference to FIGURES 4 to 6.

A gate electrode pattern 21 consisting, for example, of an aluminum layer of about 600 A. thick is first provided on a flat glass plate 20, which serves as a carrier, for example, by evaporation-deposition by means of a mask. FIGURE 4 is a cross sectional view at right angles to the gate electrode which has, for example, the shape shown in broken lines in FIGURE 3 or, in other words, the complementary shape and dimensions of the source and drain electrode pattern of the example described hereinbefore. The gate electrode pattern 21 is covered with an insulating layer, for example, by covering the whole of the carrier 21 with a silicon-oxide film or, as shown in FIGURE 4, by anodically oxidizing the aluminum layer first provided such that a surface film 22 thereof having a thickness of, for example, 200 A. is converted into aluminum oxide.

Subsequently, a conductor layer 23 is applied having the same composition and thickness as in the previous example. Lastly, a photosensitive emulsion 24, which consists of a positive photoresist, is provided on the semiconductor layer 23. Such a positive photoresist with the associated solvents is commercially sold by Kalle Aktiengesellschaft, Wiesbanden, for example, under the denomination Kalle Kopierlack P (positive), RE 2327–50.

By means of exposure, preferably by means of a substantially parallel light beam 29 which is incident substantially at right angles on the semiconductor layer 23 and the carrier 20, an optical image is produced in the positive photoresist layer 24 due to the shadow effect of the gate electrode 21, 22, whereby the exposed areas of the photoresist become selectively soluble whereas the portion 30, which lies in the shadow, remains in the insoluble state. The exposed portions of the photoresist layer 24 are now removed by means of the associated solvent so that a photoresist pattern 30 remains which corresponds to the shape of the gate electrode (see FIGURE 5).

A metal layer 31, for example, of tin, silver, gold or antimony, or mixtures thereof, having a thickness of, for example, 250 A. and having the form of a strip intersecting the gate electrode 21 is now evaporation deposited on the semiconductor layer 23 and the photoresist pattern 30.

The photoresist 30, together with the portion of the metal layer 31 located on it, is now removed which may be effected, for example, after exposure through the metal layer 31 by means of an associated solvent. To this end, the metal layer 31 is preferably not made too thick, so that the light and the solvent can penetrate into the layer 30. After removal of the photoresist pattern 30, the negative image of the gate electrode 21, 22 thus remains from the metal layer 30, resulting in a source electrode 31*a* and a drain electrode 31*b* (see FIGURE 6) being obtained which jointly have an electrode pattern near the crossing which is substantially complementary to that of the gate electrode 21, 22 first provided.

Although in the example described with reference to FIGURES 4 to 6, the gate electrode pattern is provided first and then the other pattern by photographic means, it is in the case of a positive photoresist also possible in a similar manner to reverse the sequence and to provide first the pattern of the source and drain electrodes on the carrier and then the semiconductor layer and the insulating layer of the gate electrode, whereafter the gate electrode pattern is formed on the said insulating layer in an analogous manner according to the invention.

In the preceding two examples the two electrode patterns are formed on opposite sides of the semiconductor layer so that upon irradiation from the side of the carrier the semiconductor must also be such as to transmit the radiation required. Photoresist materials are already sold such as, for example, the Kodak Ortho Resist (KOR), which are sensitive as far as into the green portion of the visible spectrum so that semiconductors with a smaller energy gap such as, for example, cadmium sulphide or zinc cadmium sulphide can also be used.

Figure 7:
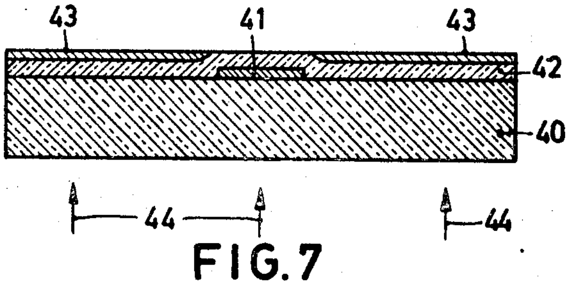
FIGURES 7 and 8 are cross sectional views of yet another embodiment of the invention in sequential stages of the manufacture according to the invention.
Figure 8:
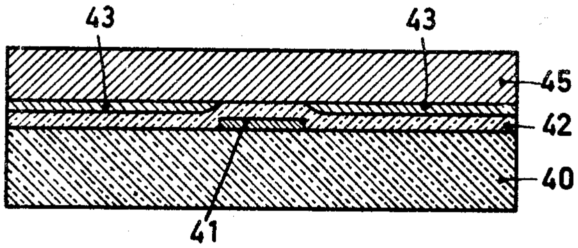

Lastly, one special embodiment of the invention will briefly be described with reference to FIGURES 7 and 8 in which the semiconductor layer is provided only after use of the photographic process and in which therefore in principle semiconductors of any type can be used.

According to the invention a gate electrode pattern 41 is first formed on a glass carrier 40 and then an insulating layer 42 which consists, for example, of silicon oxide. The gate electrode layer 41 is, for example, 500 A. thick and the insulating layer is likewise approximately 500 A. thick. A complementary pattern 43 of the source and drain electrodes is now formed on the insulating layer 42 by the use of the invention by photographic means while irradiating by means of a light beam 44 which can penetrate through the carrier 40 and the insulating layer 42 to the side of the insulating layer 42 which is remote from the carrier while forming a shadow of the pattern 41 and can produce in situ the complementary pattern 43 of the source and drain electrodes with the use of a photochemical reaction. To obtain the complementary pattern 43 on the insulating layer 42 it is possible to use, for example, the same photoresist method with a negative photoresist as has been described for providing the gate electrode 11 on the insulating layer 6 with reference to FIGURES 1, 2 and 3, or the photoresist method with a positive photoresist as has been described with reference to FIGURES 4 to 6, or any of the other photographic processes previously referred to.

Subsequently a semiconductor layer 45 (see FIGURE 8) which consists, for example, of cadmium sulphide is formed on the electrode pattern 43 and the uncovered portion of the insulating layer 42.

In conclusion, it is to be noted that the invention is not limited to the examples herein described and that many further variations are possible for a man skilled in the art without passing beyond the scope of the invention. Thus, an expert may use, for example, another photographic process in which, for example in the case of FIGURE 1, the metal layer 7 is omitted and the negative photoresist is formed directly on the insulating layer 6, in the case of a gate electrode, or on the semiconductor layer 5 in the case of a source and drain electrode. A certain amount of electrode material in the finely-divided state is previously provided in the negative photoresist. After exposure and dissolution of the unexposed portions, a complementary pattern of photoresist having a content of electrode material then subsists, which may be afterheated, if desired, to burn or evaporate the photoresist at least in part so that only the electrode material remains on the substrate in the desired pattern. Instead of the photoresist techniques, use may be made of the other photochemical processes already referred to in which the photochemical substance itself yields the conductive pattern, if desired after the use of secondary chemical reactions. In the preceding examples exposure always took place through the carrier. However, use may also be made of photographic methods analogous to those employed in the photographic printing technique for the manufacture of reflex copies, if at least the photosensitive material, for example, the photoresist and the difference in reflection or absorption of the electrode material of one pattern in comparison with its ambience are suitably chosen. When using such a reflex-copy method there is exposed, for example, in the case of FIGURE 1 from the upper side through the photosensitive layer 10 whereby the intensity level of the incident radiation is in itself still insufficient to give rise to the photochemical reaction. However, the additional intensity and the intensity difference of the reflected light are sufficient to bring about a photochemical conversion with the desired optical image of one pattern in the photochemical layer. An optical image is obtained due to either the electrode pattern already provided reflecting more light than the substrate, or the substrate reflecting more light than the electrode pattern. In each case, the complementary electrode pattern may be formed, for example, by means of a photoresist method with a positive or negative photoresist in combination with a metal layer to be applied before or afterwards. The reflex-photographic method may also be advantageous, for example, if the two electrode patterns are formed on the side of the semiconductor layer remote from the carrier. In this case the pattern of the source and drain electrode may first be formed on the semiconductor layer and then the insulating layer of the gate electrode, on which the gate electrode pattern may be obtained by the use of the invention with no need for the exposure to take place through the semiconductor layer.

In the preceding examples the source and drain electrodes are located on the same side of the semiconductor layer. However, within the scope of the invention, it is also possible, for example, first to form the gate electrode on one side and then next to it, one of the two other electrodes on the same side by the use of the method according to the invention, whereafter the remaining electrode is formed on the other side, if desired likewise by the use of the invention.

In the foregoing the manufacture of a semiconductor device having only one transistor has been described by way of example and for the sake of simplicity. However, it will be evident that the invention is applicable in a similar manner to the manufacture of a large number of transistors on a carrier, in which event the transistors may be interconnected or through connected to other circuit elements and thus united to form a complex semiconductor device. In such a device the source and drain electrodes of one transistor may first be formed, for example, on the side of the carrier and at the same time the gate electrode of another transistor and then by the use of the invention the complementary gate electrode of one transistor and the complementary source and drain electrodes of the other transistor may be manufactured on the other side of the semiconductor layer. Through connecting may take place, for example, in a separate operation which is a simple matter because the dimensions and the relative positioning of the lead-through conductors need be much less accurate than in the effective portion of the transistor. The method according to the invention may also be used only locally on the carrier by exposing only locally by means of a mask or providing the photosensitive material only locally. The carrier need not be made of a material different from that of the semiconductor layer and may consist, for example, of the same semiconductor having a higher specific resistance.

The shape of the electrode patterns may also be different. Thus, for example, the gate electrode may be comb-shaped, while the source and drain electrodes in the form of a plurality of strips may be situated alternately between the teeth of the comb-shaped gate electrode. In yet another embodiment the source and drain electrodes may be positioned concentrically, while the gate electrode covers the interspace.

What is claimed is:

1. A method of manufacturing a semiconductor device of the thin-filmed field-effect transistor type comprising supported by a carrier a layer of semiconductive material and associated therewith at least source and drain electrodes contacting the semiconductive material and separated from each other by a small gap, said electrodes constituting a first electrode system, and a gate electrode located between said electrodes when viewed in a direction at right angles to the semiconductive layer but spaced from the gap and insulated from the semiconductive material, said gate electrode constituting a second electrode system, said first and second electrode systems being in nonoverlapping relationship when viewed in a direction at right angles to the semiconductive layer, comprising the steps of forming at least part of one of said electrode systems, applying over the said one electrode system including the area where the other electrode system is to be formed a layer of a photochemically sensitive material selected from the group consisting of positive photoresistor materials which are rendered selectively soluble at irradiated regions, negative photoresist materials which are rendered selectively insoluble at irradiated regions, and photochemical materials which upon irradiation form a photochemical reaction product changeable to an electrically conductive metallic image, optically projecting in substantially said right-angle direction an image of the already-formed said one electrode system onto the said photochemically sensitive layer by using said already-formed electrode system for its light absorbing or reflective properties in order to expose selected regions of the latter photo-chemically sensitive layer causing same to undergo a chemical change, applying over said one electrode system the other electrode system utilizing the chemically-changed regions of the photochemically sensitive layer as a mask for locating the already-formed said one electrode system to obtain the nonoverlying relationship desired, and providing a layer of semiconductive material, said layer being in contact with the first electrode system.

2. A method as set forth in claim 1 wherein a carrier is first provided, the said one electrode system is provided on the carrier, and then the photochemically sensitive layer irradiated through the carrier and the already-formed one electrode system serving as a radiation mask and shadowing the photo-chemically sensitive material by its own structure, said carrier being substantially transparent to the radiation used, but the said one electrode system attenuating said radiation.

3. A method as set forth in claim 2 wherein a carrier is first provided, the source and drain electrodes are provided on the carrier, the layer of semiconductive material is provided over the source and drain electrodes, an insulating layer is provided over the semiconductive layer, the photochemically sensitive layer is provided over the insulating layer, and the photochemically sensitive layer is irradiated through the carrier to form an image of the gap between the source and drain electrodes on the photochemically sensitive layer.

4. A method as set forth in claim 3 wherein the semiconductive material is selected from the group consisting of $SnO_2$ and $In_2O_3$, said material being substantially transparent to the radiation used during the optical projection step.

5. A method as set forth in claim 2 wherein a carrier is first provided, the gate electrode is provided on the carrier, an insulating layer is provided over the gate, and then the photochemically sensitive layer is provided and irradiated through the carrier to form an image of the gate electrode, and after the source and drain electrodes have been provided the layer of semiconductive material is provided in contact with the source and drain electrodes.

6. A method as set forth in claim 5 wherein the semiconductive material is cadmium sulphide.

7. A method as set forth in claim 2 wherein a carrier is first provided, the gate electrode is provided on the carrier, an insulating layer is provided over the gate, a layer of semiconductive material is provided over the insulating layer, and then the photochemically sensitive layer is provided and irridiated through the carrier to form an image of the gate electrode, said semiconductive layer being substantially transparent to the radiation.

8. A method of manufacturing a semiconductor device of the thin-film field-effect transistor type comprising supported by a carrier a layer of semiconductive material and associated therewith at least source and drain electrodes contacting the semiconductive material and separated from each other by a small gap, said electrodes constituting a first electrode system, and a gate electrode located between said electrodes when viewed in a direction at right angles to the semiconductive layer but spaced from the gap and insulated from the semiconductive material, said gate electrode constituting a second electrode system, said first and second electrode systems being in nonoverlapping relationship when viewed in a direction at right angles to the semiconductive layer, comprising the steps of forming at least part of one of said electrode systems, applying over the said one electrode system including the area where the other electrode system is to be formed a layer of a photochemically sensitive material which upon irradiation forms a photochemical reaction product changeable to an electrically conductive metallic image, optically projecting in substantially said right-angle direction an image of the already-formed said one electrode system onto the said photochemically sensitive layer by using said already-formed electrode system for its light absorbing or reflective properties in order to expose selected regions of the photochemically sensitive layer causing same to undergo a chemical change, treating the chemically-changed regions of the photochemically sensitive layer to form an electrically conductive region constituting the other electrode system in non-overlying relationship with the already-formed said one electrode system, and providing a layer of semiconductive material, said layer being in contact with the first electrode system.

9. A method as set forth in claim 8 wherein the layer of photochemically sensitive material comprises a photoresist material containing electrode material in a finely-divided state, and after the irradiation step, one of the irradiated and nonirradiated parts of the layer are removed.

References Cited

UNITED STATES PATENTS

| | | | |
|---|---|---|---|
| 1,967,057 | 7/1934 | Irvine | 96—44 |
| 2,914,404 | 11/1959 | Fanselau et al. | 96—36.2 |
| 2,981,877 | 4/1961 | Noyce. | |
| 3,046,176 | 7/1962 | Bosenberg. | |
| 3,201,239 | 7/1965 | Neugebauer et al. | 96—36.3 |
| 3,222,173 | 12/1965 | Belko et al. | 96—36.2 |
| 3,223,525 | 12/1965 | Jonker et al. | 96—36.2 |
| 3,313,626 | 4/1967 | Whitney | 96—33 |

OTHER REFERENCES

Brace, I. A.: The Graphic Arts Monthly, May 1956, (pp. 26–30 relied on).

Weimer, P. K.: The TFT—A New Thin-Film Transistor, Proceeds of the IRE, June 1962 (pp. 1462–1469).

J. TRAVIS BROWN, *Primary Examiner.*

C. BOWERS, *Assistant Examiner.*

U.S. Cl. X.R.

29—578, 579, 625, 628, 630; 96—27, 35, 36, 44, 47